United States Patent
Pan et al.

(10) Patent No.: US 12,021,136 B2
(45) Date of Patent: Jun. 25, 2024

(54) GATE ISOLATION FEATURE AND MANUFACTURING METHOD THEREOF

(71) Applicant: Taiwan Semiconductor Manufacturing Co., Ltd., Hsin-Chu (TW)

(72) Inventors: Kuan-Ting Pan, Hsinchu (TW); Huan-Chieh Su, Changhua County (TW); Jia-Chuan You, Taoyuan County (TW); Shi Ning Ju, Hsinchu (TW); Kuo-Cheng Chiang, Hsinchu County (TW); Yi-Ruei Jhan, Hsinchu (TW); Li-Yang Chuang, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/361,556

(22) Filed: Jul. 28, 2023

(65) Prior Publication Data
US 2023/0411499 A1    Dec. 21, 2023

Related U.S. Application Data

(62) Division of application No. 17/091,767, filed on Nov. 6, 2020, now Pat. No. 11,799,019.
(Continued)

(51) Int. Cl.
*H01L 29/66*     (2006.01)
*H01L 21/8234*   (2006.01)
*H01L 29/06*     (2006.01)

(52) U.S. Cl.
CPC .. *H01L 29/6681* (2013.01); *H01L 21/823431* (2013.01); *H01L 29/0649* (2013.01); *H01L 29/0669* (2013.01)

(58) Field of Classification Search
CPC .......... H01L 29/66795; H01L 29/0669; H01L 29/0673; H01L 21/823431; H01L 29/6681; H01L 29/0649; H01L 21/02507; H01L 21/76834; H01L 21/823468; H01L 29/785; H01L 29/66545; H01L 29/42392; H01L 29/78696; H01L 21/823481;
(Continued)

(56) References Cited

U.S. PATENT DOCUMENTS 8,796,666 B1    8/2014  Huang
8,815,712 B2    8/2014  Wan
(Continued)

*Primary Examiner* — Mouloucoulaye Inoussa
(74) *Attorney, Agent, or Firm* — Haynes and Boone, LLP

(57) ABSTRACT

A semiconductor structure includes a plurality of fin structures extending along a first direction, a plurality of gate structure segments positioned along a line extending in a second direction, the second direction being orthogonal to the first direction, wherein the gate structure segments are separated by dummy fin structures. The semiconductor structure further includes a conductive layer disposed over both the gate structure segments and the dummy fin structures to electrically connect at least some of the gate structure segments, and a cut feature aligned with one of the dummy fin structures and positioned to electrically isolate gate structure segments on both sides of the one of the dummy fin structures.

20 Claims, 9 Drawing Sheets

Related U.S. Application Data

(60) Provisional application No. 62/982,149, filed on Feb. 27, 2020.

(58) Field of Classification Search
CPC ......... H01L 21/0337; H01L 21/823437; H01L 21/76832; H01L 27/0886; H01L 29/66439; H01L 21/76876; H01L 21/02532; H01L 21/76897; H01L 21/823412; H01L 29/165; H01L 29/775; H01L 21/02603; H01L 21/823418; H01L 29/66553; H01L 29/6656; H01L 29/7851; H01L 21/823475; H01L 29/0847; H01L 21/76805; H01L 27/092; H01L 21/02636; H01L 21/823807; H01L 21/823878; H01L 29/1033; H01L 29/0653; H01L 21/823842; H01L 29/7848; B82Y 10/00
See application file for complete search history.

(56) References Cited

U.S. PATENT DOCUMENTS

| | | |
|---|---|---|
| 8,963,258 B2 | 2/2015 | Yu |
| 9,093,530 B2 | 7/2015 | Huang |
| 9,171,929 B2 | 10/2015 | Lee |
| 9,214,555 B2 | 12/2015 | Oxland |
| 9,236,267 B2 | 1/2016 | De |
| 9,520,482 B1 | 12/2016 | Chang |
| 9,548,303 B2 | 1/2017 | Lee |
| 9,576,814 B2 | 2/2017 | Wu |
| 10,510,620 B1 | 12/2019 | Chanemougame |
| 2013/0285116 A1 | 10/2013 | Lochtefeld |
| 2015/0076609 A1 | 3/2015 | Xie |
| 2017/0236836 A1 | 8/2017 | Huo |
| 2018/0342427 A1 | 11/2018 | Xie |
| 2019/0088798 A1 | 3/2019 | Kim |
| 2019/0139957 A1 | 5/2019 | Liao |
| 2020/0020794 A1 | 1/2020 | Lin |
| 2020/0035567 A1* | 1/2020 | Chanemougame ... H01L 29/401 |
| 2020/0083222 A1 | 3/2020 | Kim |
| 2020/0105581 A1 | 4/2020 | Chang |
| 2020/0105583 A1 | 4/2020 | Wang |
| 2020/0105903 A1 | 4/2020 | Ching |
| 2020/0105930 A1 | 4/2020 | Yang |
| 2020/0127113 A1 | 4/2020 | Ching |
| 2020/0168716 A1 | 5/2020 | Peng |
| 2020/0243665 A1* | 7/2020 | Ching ............... H01L 21/02507 |
| 2020/0294863 A1 | 9/2020 | Chiang |
| 2020/0303373 A1 | 9/2020 | Glass |
| 2020/0328208 A1 | 10/2020 | Chiang |
| 2020/0343377 A1 | 10/2020 | Chiang |
| 2020/0357911 A1 | 11/2020 | Frougier |
| 2020/0365692 A1 | 11/2020 | Jung |
| 2020/0395463 A1 | 12/2020 | Park |
| 2020/0411661 A1 | 12/2020 | Guler |
| 2021/0057281 A1 | 2/2021 | Liaw |
| 2021/0057525 A1 | 2/2021 | Chiang |
| 2021/0057535 A1 | 2/2021 | Chiang |
| 2021/0082966 A1 | 3/2021 | Lin |
| 2021/0091075 A1 | 3/2021 | Liao |
| 2021/0091179 A1 | 3/2021 | Wang |
| 2021/0134797 A1 | 5/2021 | Lin |
| 2021/0183707 A1 | 6/2021 | Ng |
| 2021/0202498 A1 | 7/2021 | Liaw |
| 2021/0210349 A1 | 7/2021 | Xie |
| 2021/0391421 A1 | 12/2021 | Chu |

* cited by examiner

GATE ISOLATION FEATURE AND MANUFACTURING METHOD THEREOF

PRIORITY DATA

The present application is a divisional application of U.S. patent application Ser. No. 17/091,767, filed Nov. 6, 2020, which claims the benefit of U.S. Patent Provisional Application No. 62/982,149, filed Feb. 27, 2020, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
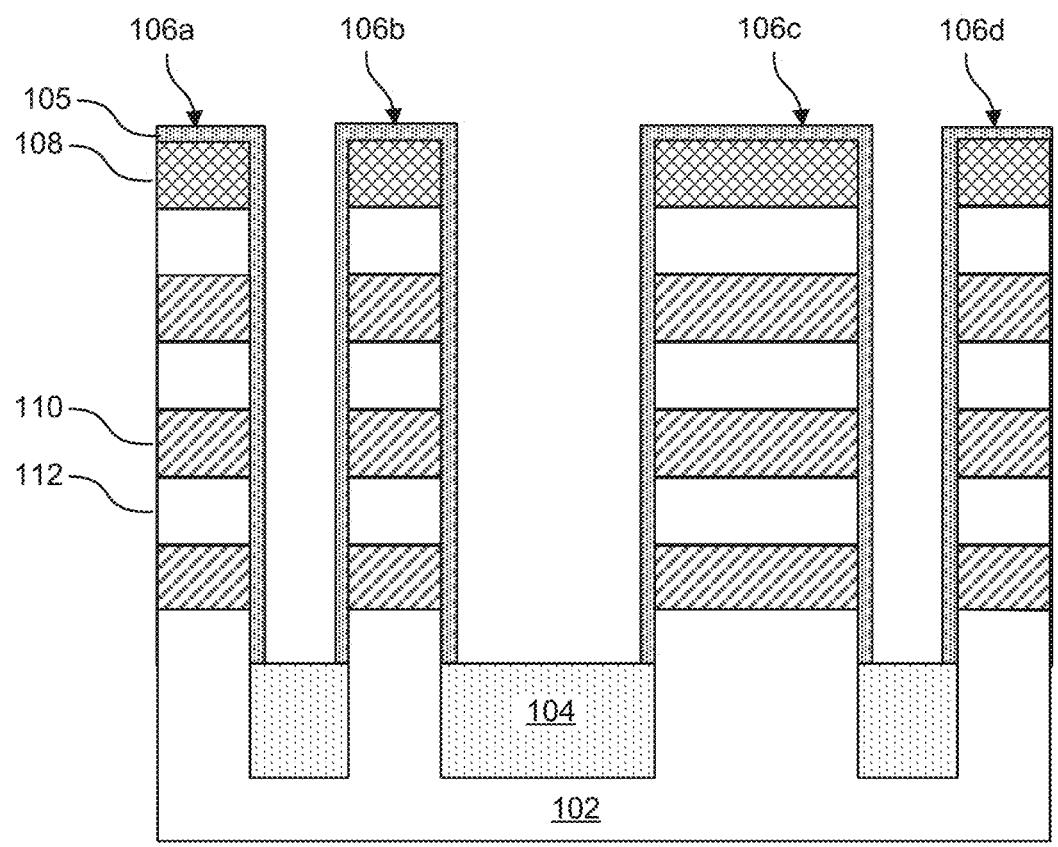
FIGS. 1A, 1B, 1C, 1D, 1E, 1F, and 1G are diagrams showing an illustrative process for forming a gate cut feature, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to methods of fabricating field-effect transistors (FETs), particularly, as Gate All-Around (GAA) transistors or fin-like FETs (FinFETs). In GAA transistor devices, the gate surrounds the channel on all sides. For example, the gate entirely encompasses one or more nanostructures that are suspended between active source/drain regions. GAA devices are formed by depositing alternating layers of different semiconductor materials (e.g., silicon and silicon germanium). These alternating layers may then be patterned to form fin structures. Then, after various other structures are put in place, one of the materials, such as the silicon germanium can be removed, thus leaving nanowires or nanosheets in place. Then, the gate layers (high-k, work-function, metal gate) may then be formed so as to completely surround each of the nanowires and nanosheets.

FinFET devices provide for improved device performance over planar transistors because in a finFET device, the gate surrounds three sides of the channel. Conventional methods for forming a finFET device involve forming a dummy gate over a set of fin structures running in parallel. Sidewall spacers are then formed on the sidewalls of the gate. After the sidewall spacers are formed, source/drain regions may be formed on the fin structures on both sides of the gate. After the source/drain regions are formed, and an interlayer Dielectric Layer (ILD) is formed over the source/drain regions, the dummy gate can be replaced with a real gate that includes a conductive material such as a metal material.

One challenge with semiconductor fabrication is designing patterns while taking the spacing requirement of cut gate structures. Cut gate structures are formed by etching away a portion of a deposited gate and filling the trench with a dielectric material, thereby "cutting" the metal gate feature so that gate segments on both sides of the cut feature are electrically isolated from each other.

According to principles described herein, the spacing constraints for cut features and alignment process is substantially improved by changing the depth at which cut features are able to be made. Specifically, dielectric dummy fin structures are formed between the functional fin structures. In some instances, the dielectric dummy fin structure is also called as a hybrid fin structure. Then, a gate layer is deposited over both the functional fin structures and the dummy fin structures. The gate layer is then etched back to expose top surfaces of the dummy fin structures. Thus, each dummy fin structure separates the gate layer into different gate segments. Then, a conductive layer, such as Tungsten, is deposited over the gate layer and the dummy fin structures. The conductive layer electrically connects the gate layer segments. To cut the gate layer, a cut feature is formed over one of the dummy fin structure. Thus, the cut feature "cuts" the conductive layer over the dummy fin structure and thus electrically isolates two adjacent gate layer segments.

Using the principles described herein, the overlay constraints for cut features are reduced because the cut feature may be placed anywhere over a dummy fin structure. Furthermore, the circuit can be designed by spacing fin structures closer together, even where gate features are to be cut.

FIG. 1A illustrates a workpiece that includes a semiconductor substrate 102 and fin structures 106a, 106b, 106c, 106d separated by shallow trench isolation (STI) regions 104. The semiconductor substrate 102 may be a silicon substrate. The semiconductor substrate may be part of a silicon wafer. Other semiconductor materials are contemplated. The substrate 102 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a silicon layer formed on a silicon oxide layer. In another example, the substrate 102 may include a conductive layer, a semiconductor layer, a dielectric layer, other layers, or combinations thereof.

The fin structures 104 may include stacked channel structures, such as nanostructures including nanowires or nanosheets. Such structures are used in gate-all-around (GAA) transistor devices. In GAA transistor devices, the gate surrounds the channel on all sides. For example, the gate entirely encompasses one or more nanostructures that are suspended between active source/drain regions. The principles described herein may be applied to fin structures that have a gate on three sides, as well as fin structures that are processed to include nanostructures. The example described herein includes nanostructures. Thus, the term fin structures as used herein may include a nanowire or nanosheet stack formed from a fin structure.

To form the fin structures 106a, 106b, 106c, 106d, alternating layers 110, 112 of differing semiconductor materials may be deposited onto the substrate 102. For example, if the substrate is a silicon substrate, then alternating layers of silicon and silicon germanium (SiGe) may be deposited. Then, a hard mask layer 108 may be deposited on top of the alternating semiconductor layers. The hardmask layer 108 may include at least one of silicon oxide (SiO2), silicon nitride (SiN), silicon carbide (SiC), silicon oxynitride (SiON), silicon oxycarbide (SiOCN), hafnium oxide (HfO2), aluminum oxide (Al2O3), and zirconium oxide (ZrO2). Other materials are contemplated. A photoresist material may then be used to pattern the hard mask 108 layer. The photoresist may then be exposed to a light source through a photomask. The photoresist may then be developed such that the portions of the photoresist remain while other portions are removed. The pattern within the developed photomask is then transferred to the hard mask layer 108, which is then transferred to the substrate 102 and alternating semiconductor layers through an etching process. This forms the fin structures 106a, 106b, 106c, 106d as shown. The fin structures comprise elongated fin-like structures that run parallel to each other.

After, the fin structures 106a, 106b, 106c, 106d are formed, an STI layer 104 may be deposited, and then etched back to the desired height. The STI layer 104 separates the fin structures from each other. The STI layer 104 may be recessed to a point approximately halfway between a bottom and a top of the fin structure. However, in some examples, the STI layer 104 may be recessed to different heights along the height of the fin structures 106a, 106b, 106c, 106d.

After the STI layer 104 is formed, a cladding material 105 may be conformally deposited over the fin structures. The cladding material 105 may be the same material as one of the alternating semiconductor layers, particularly, the semiconductor material that is to be removed. Thus, in the example where the alternating layers are silicon 112 and silicon germanium 110, then the cladding material 105 may be silicon germanium.

Figure 1B:
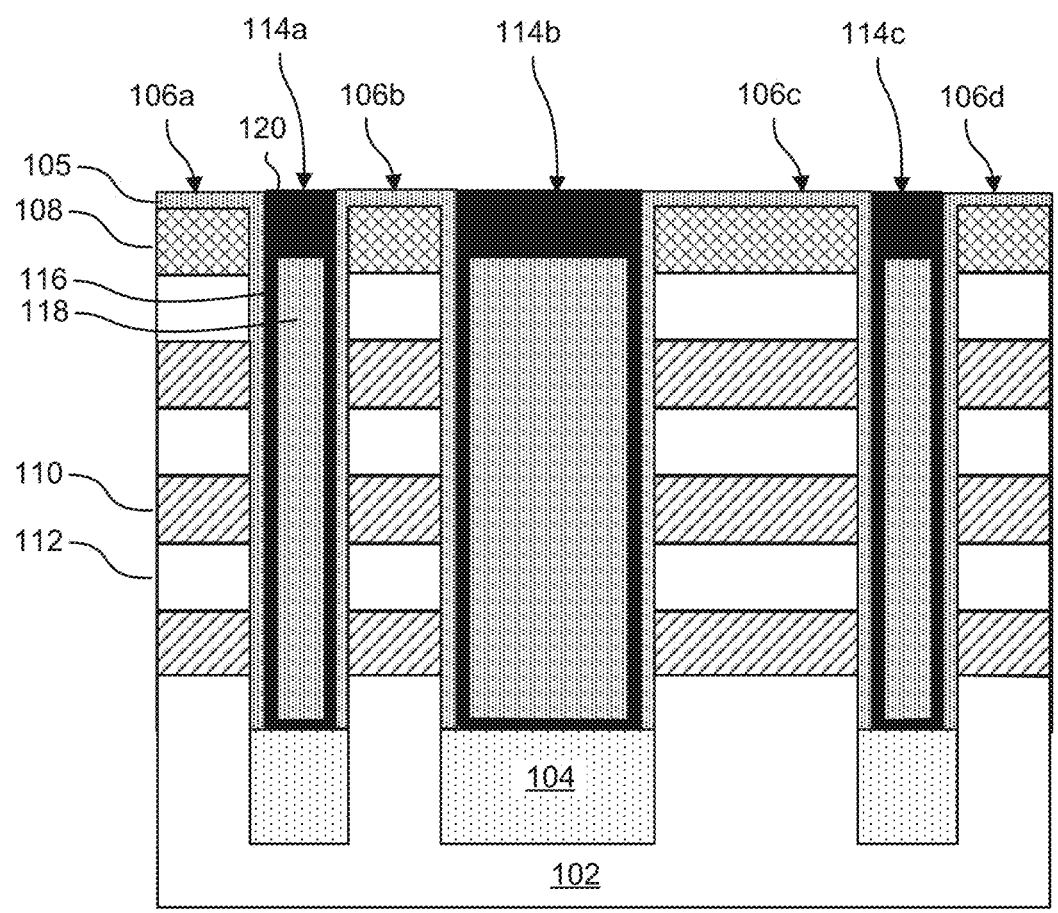

FIG. 1B illustrates the formation of dummy fin structures 114a, 114b, 114c between the real fin structures 106a, 106b, 106c, 106d. The dummy fin structures may be formed by several processes. Specifically, a dielectric material 116 may be conformally deposited within the trenches between the real fin structures 106a, 106b, 106c, 106d. This dielectric material may be, for example, silicon nitride (SiN), silicon oxynitride (SiON), or silicon carbide (SiC). Other dielectric materials may be used. The dielectric material 116 may be deposited using an Atomic Layer Deposition (ALD) process.

After the conformal dielectric layer 116 is formed, an oxide layer 118 is deposited on the dielectric layer 116. The oxide layer 118 may be, for example, silicon oxide. In some examples, the oxide layer 118 may be the same type of material used for the STI layer 104. The oxide layer 118 may be formed, for example, using a Chemical Vapor Deposition (CVD) process. Other processes may be used as well. After the oxide layer 118 is formed, a Chemical Mechanical Polishing (CMP) process may be applied to planarize the top surface of the workpiece. A CMP process involves applying a slurry to the surface of the workpiece. The slurry includes etching chemicals as well as solid particles. A polishing head is then moved across the surface of the workpiece and the chemical and mechanical forces on the workpiece result in removing material from the workpiece at a substantially similar rate so as to create a planar surface.

An etching process may then be applied to selectively remove the oxide layer 118 while leaving the cladding layer 105 substantially intact. The etching process may be, for example, a dry etching process. In some examples, the etching process is applied so that, after the etching process, the top surface of the oxide layer 118 is about 5-15 nanometers higher than a top surface of the top channel 112 of the fin structures 106a, 106b, 106c, 106d. If the height difference is smaller than 5 nanometers, a subsequent high-k dielectric layer increases, thereby increasing parasitic capacitance, in some instances. If the height difference is greater than 15 nanometers, a subsequent high-k material layer is insufficient to protect gate spacers during an etching operation for contact features, in some instances.

After the oxide layer 118 has been partially etched back, a high-k dielectric layer 120 may be deposited at the top of the dummy fin structures 114a, 114b, 114c. The high-k dielectric layer 120 may fill the space left by the etching process that etches back the oxide layer 118. The high-k dielectric layer may be, for example, hafnium oxide ($HfO_2$), zirconium oxide (ZrO$_2$), hafnium aluminum oxide (HfAlOx), hafnium silicon oxide (HfAlOx), or aluminum oxide (Al$_2$O$_3$). The bottom surface of the high-k dielectric layer 120 may be about 5-15 nanometers higher than a top surface of the top channel 112 of the fin structures 106a, 106b, 106c, 106d.

Figure 1C:
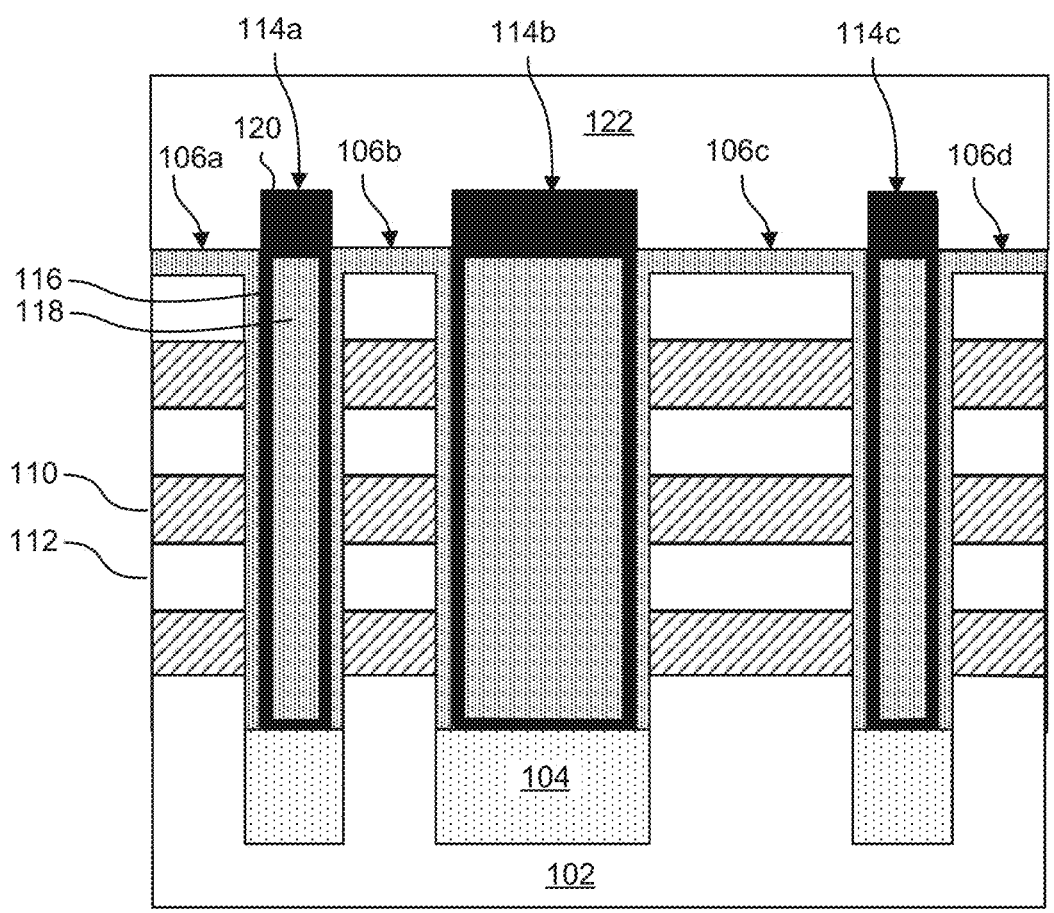

FIG. 1C illustrates the formation of a temporary dummy gate 122. The dummy gate is placed where a metal gate may ultimately be formed. Sidewall spacers (not shown) may be formed on both sides of the dummy gate. Then, source/drain regions (not shown) may be formed within the channel regions 112 of the fin structures 106a, 106b, 106c, 106d. The source/drain regions may be formed by removing part of the fin structure and replacing it with an epitaxially grown doped region. After the source/drain regions are formed, the dummy gate 122 may be removed.

Figure 1D:
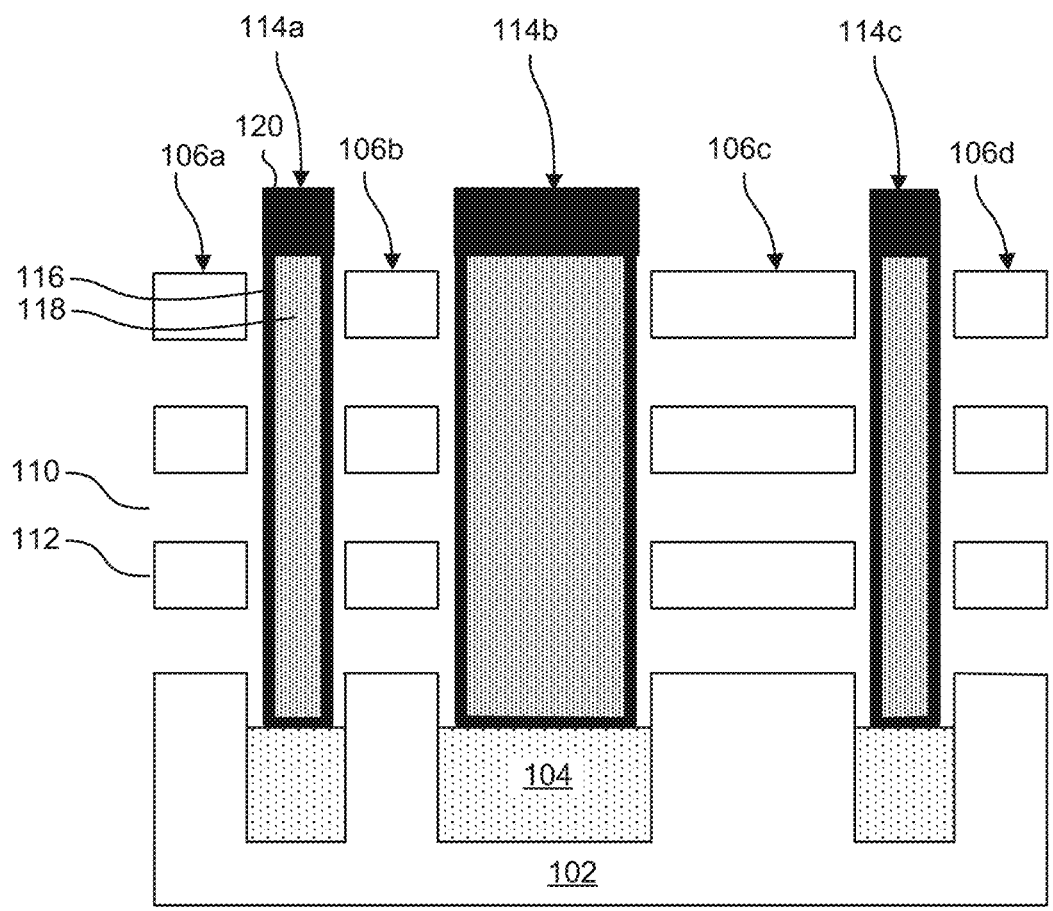

FIG. 1D illustrates removal of the cladding material 105 and the non-channel regions 110 of the fin structure 106a, 106b, 106c, 106d. In the example where the channel portions 112 are silicon and the non-channel regions 110 are silicon germanium, then the etching process used to remove the non-channel regions 110 and the cladding material 105 may be configured to selectively remove silicon germanium while leaving silicon substantially intact. In some examples, if the cladding material 105 is different than the non-channel regions 110, then two separate etching processes may be used to remove the cladding material 105 and the non-channel regions 110. In either case, an etching process used to remove such regions may be, for example, a wet etching process. With the channel regions 112 exposed, the process for forming the real metal gate may be started. This may involve forming various layers around the channel regions 112, such as high-k gate layers (not shown) and/or workfunction layers (not shown). Such workfunction metal is designed to give metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Various examples of n-type workfunction metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC)

In some examples, the wet etching process may use an acid-based etchant such as: sulfuric acid (H2SO4), perchloric acid (HClO4), hydroiodic acid (HI), hydrobromic acid (HBr), nitric acide (HNO3), hydrochloric acid (HCl), acetic acid (CH3COOH), citric acid (C6H8O7), potassium periodate (KIO4), tartaric acid (C4H6O6), benzoic acid (C6H5COOH), tetrafluoroboric acid (HBF4), carbonic acid (H2CO3), hydrogen cyanide (HCN), nitrous acid (HNO2), hydrofluoric acid (HF), or phosphoric acid (H3PO4). In some examples, an alkaline-based etchant may be used. Such etchants may include but are not limited to ammonium hydroxide (NH4OH) and potassium hydroxide (KOH).

Figure 1E:
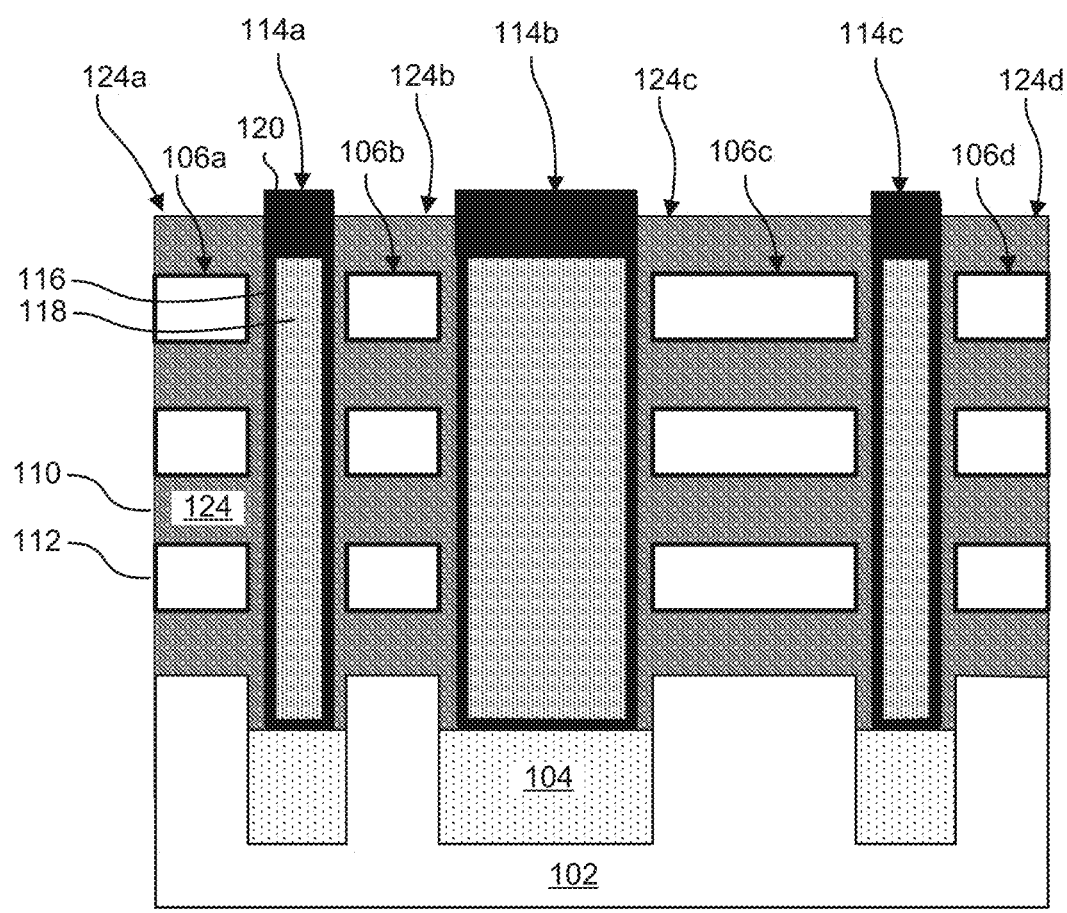

FIG. 1E illustrates formation of metal gate segments 124a, 124b, 124c, 124d for each of the fin structures 106a, 106b, 106c, 106d. Formation of the metal gate segments may begin by depositing a metal material 124 within the spaces left by the previous removal process. The metal material 124 surrounds each of the channel regions 112. After the metal material 124 has been deposited, the metal material 124 may be etched back so that the top surface of the metal material 124 is lower than a top surface of the dummy fin structures 114a, 114b, 114c. This etching process may be, for example, a dry etching process. The etching process exposes the top surface of the dummy fin structures 114a, 114b, 114c. The etching process may be applied such that the top surface of the metal gate segments 124a, 124b, 124c, 124d is less than 2 nanometers from the top surface of the dummy fin structures 114a, 114b, 114c. If the height difference is greater than 2 nanometers, a portion of work function metal(s) is damaged, which impacts a device threshold voltage, in some instances.

Figure 1F:
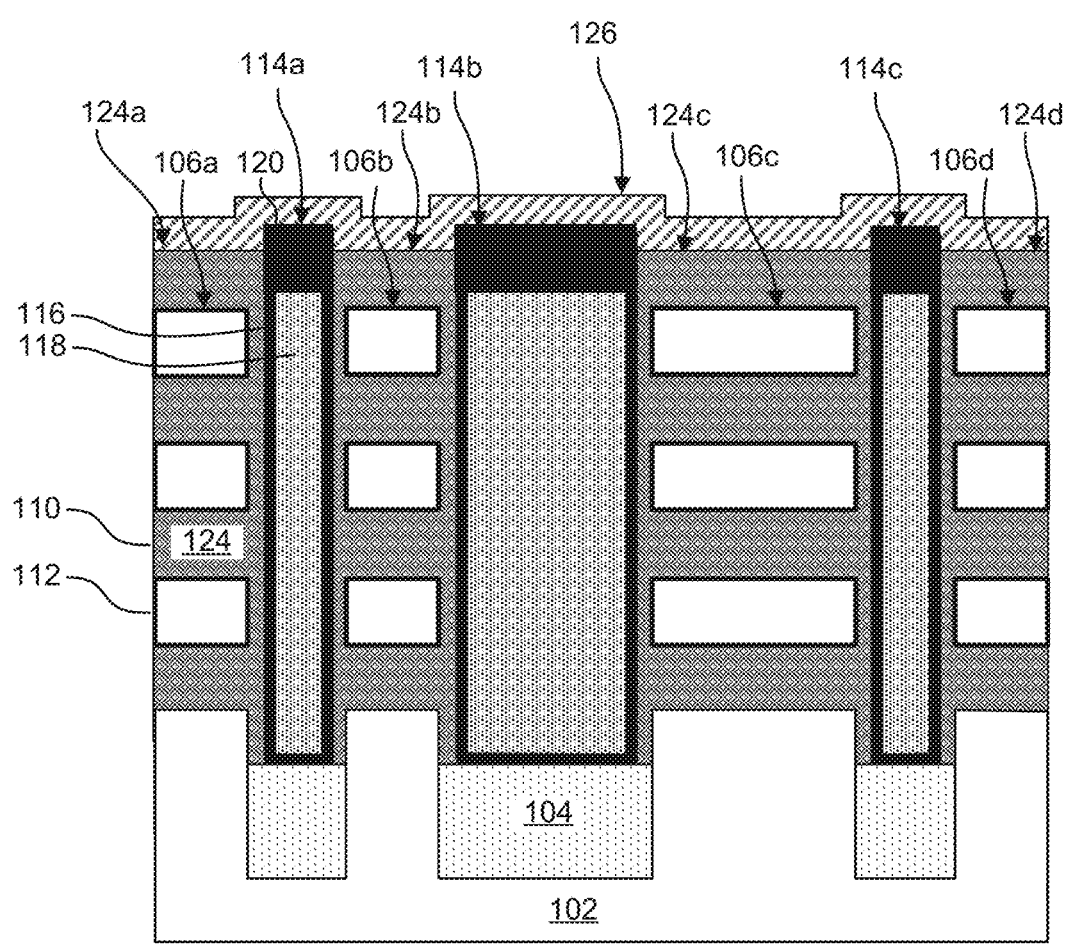

FIG. 1F illustrates the formation of a conductive layer 126 that covers both the metal gate segments 124a, 124b, 124c, 124d and the top surfaces of the dummy fin structures 114a, 114b, 114c. The conductive layer 126 thus electrically connects the gate segments 124a, 124b, 124c, 124d to each other. The conductive layer 126 includes at least one of tungsten (W), cobalt (Co), ruthenium (Ru), and copper (Cu). In some examples, a thin layer is optionally deposited before the conductive layer is deposited. The thin layer includes at least one of titanium (Ti), titanium nitride (TiN), tantalum (Ta), tantalum nitride (TaN), cobalt (Co) and ruthenium (Ru). The conductive layer 126 may be deposited using various depositing techniques, such as CVD.

Figure 1G:
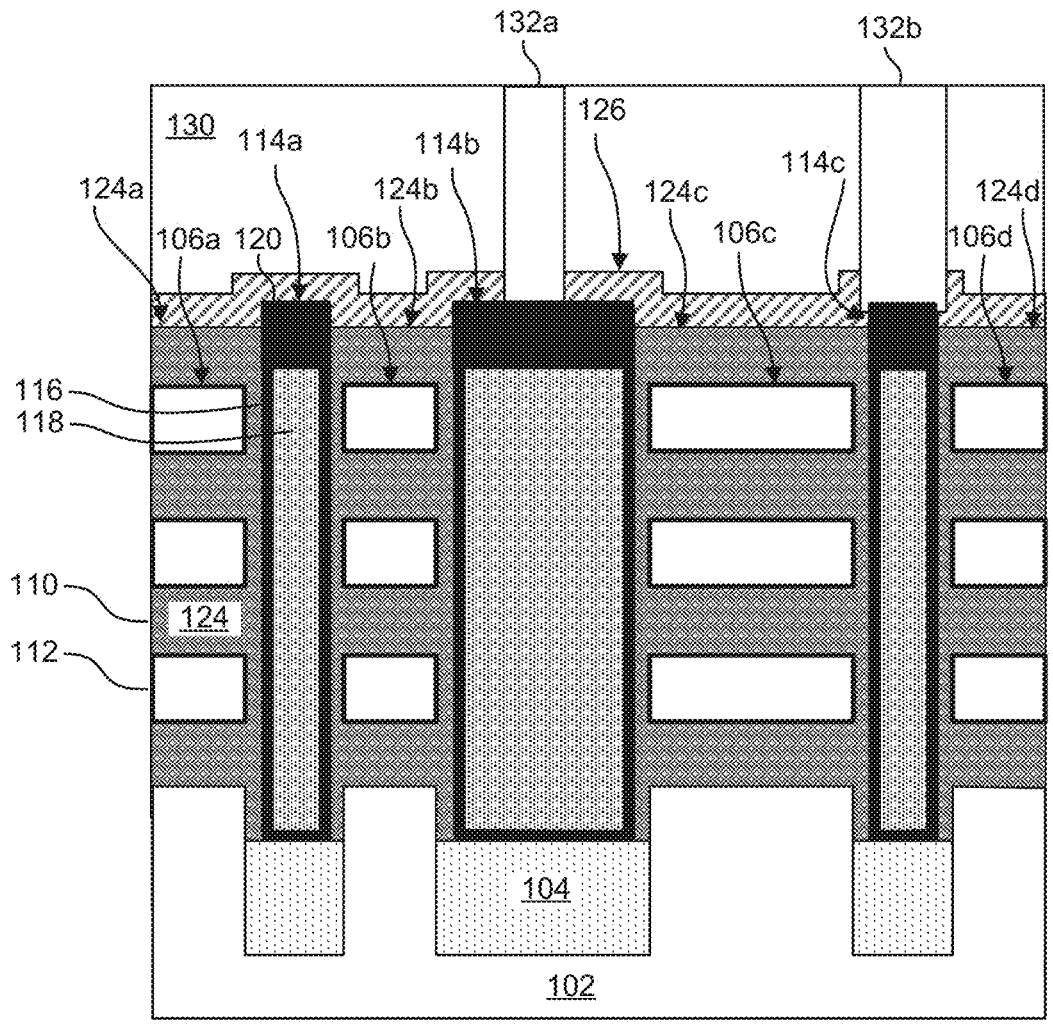

FIG. 1G illustrates the formation of a dielectric layer 130 as well as cut features 132a, 132b. The dielectric layer 130, as well as the cut features 132a, 132b, includes at least one of silicon nitride (SiN), silicon oxynitride (SiON), silicon carbon (SiC) and silicon oxycarbide (SiCN). According to the present example, the dielectric layer 130 is deposited over the conductive layer 126. The dielectric layer 130 may also be referred to as a self-aligned capping layer. After the dielectric layer is deposited, it may be patterned. The patterning process may involve depositing a hard mask layer and a photoresist layer. The photoresist may then be exposed to a light source through a photomask. The photoresist may then be developed to leave a pattern in the photoresist. That pattern may then be transferred to the hard mask. An etching process, such as a dry etching process, may then be applied to the dielectric layer 130 through the hard mask. That etching process may form trenches that extend all the way to the dummy fin structure. In other words, the etching process may remove both portions of the dielectric layer 130 and portions of the conductive layer 126 to expose top surfaces of some of the dummy fin structures. Thus, the etching process "cuts" the conductive layer.

After the etching process is performed, cut features 132a, 132b are formed within the trench left by the etching process. The cut features 132a, 132b may include a dielectric material and in some examples may be the same material as the dielectric layer 130. In some examples, however, the cut features 132a, 132b may include a different dielectric feature.

The cut features 132a, 132b electrically isolate different metal gate segments 124. For example, cut feature 132a electrically isolates metal gate segments 124b and 124c. Similarly, cut feature 132b electrically isolates metal gate segments 124c and 124d. Because there is no cut feature above dummy fin structure 114a, the metal gate segments 124a and 124b remain electrically connected through the conductive layer 126.

In the present example, the width of cut feature 132a is less than the width of dummy fin structure 114b to which it connects. However, the width of cut feature 132b is greater than the width of dummy fin structure 114c to which it connects. In some examples, the cut feature 132b may extend to the top surface of the metal gate segments 124c, 124d and thus partially cover the top-most portion of side surfaces of the dummy fin structure 114c.

Figure 2:
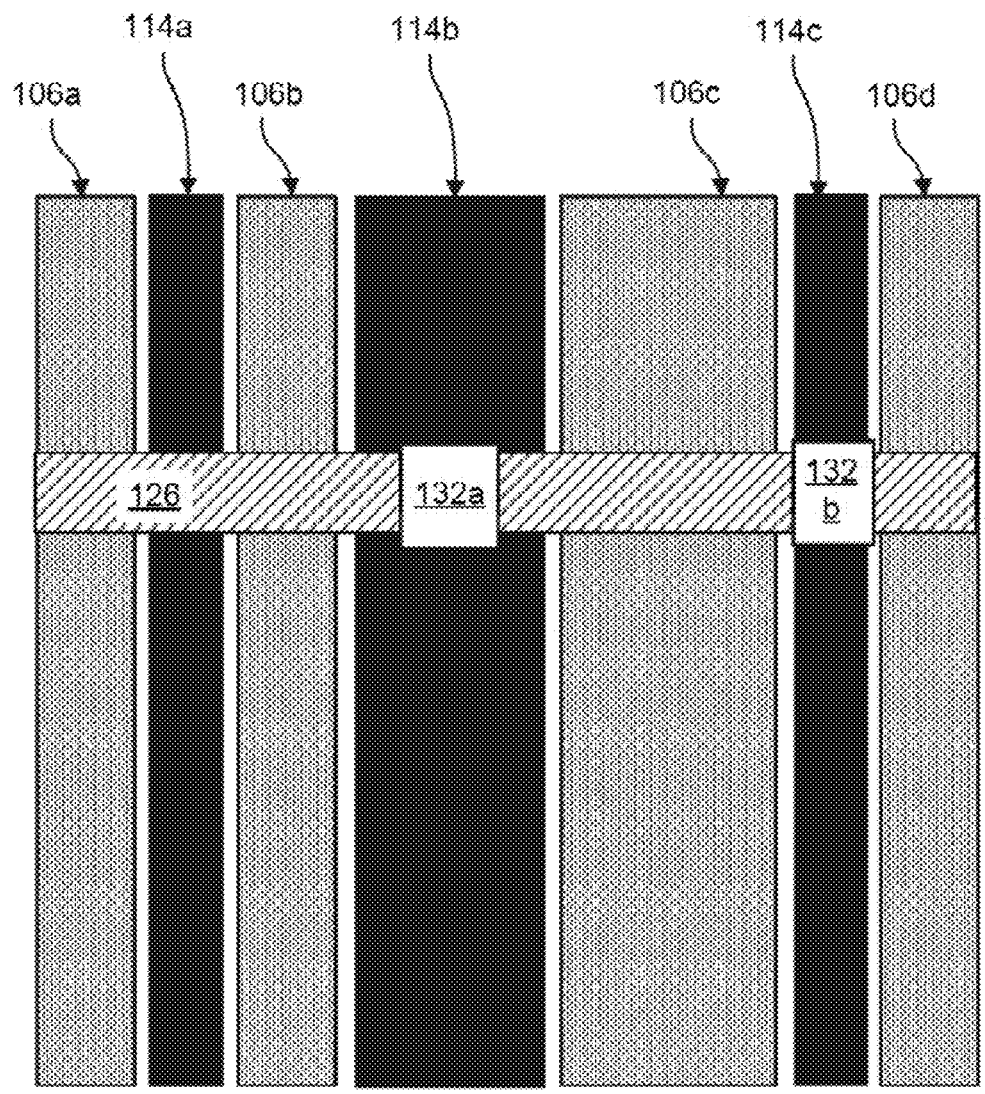
FIG. 2 is a diagram showing a top view of the gate cut feature, according to one example of principles described herein.

FIG. 2 is a diagram showing a top view of the gate cut feature. FIG. 2 thus illustrates the real fin structures 106a, 106b, 106c, 106d as well as the dummy fin structures 114a, 114b, 114c which extend along a first direction. The conductive layer 126, which covers the metal gate segments 124, extends in a second direction that is perpendicular to the first direction. As can be seen, gate cut feature 132a is positioned over dummy fin structure 114b and cuts the portion of conductive layer 126 between fin structures 106b and 106c. Similarly, gate cut feature 132b is positioned over dummy fin structure 114c and cuts the portion of the conductive layer 126 between fin structures 106c and 106d.

Figure 3:
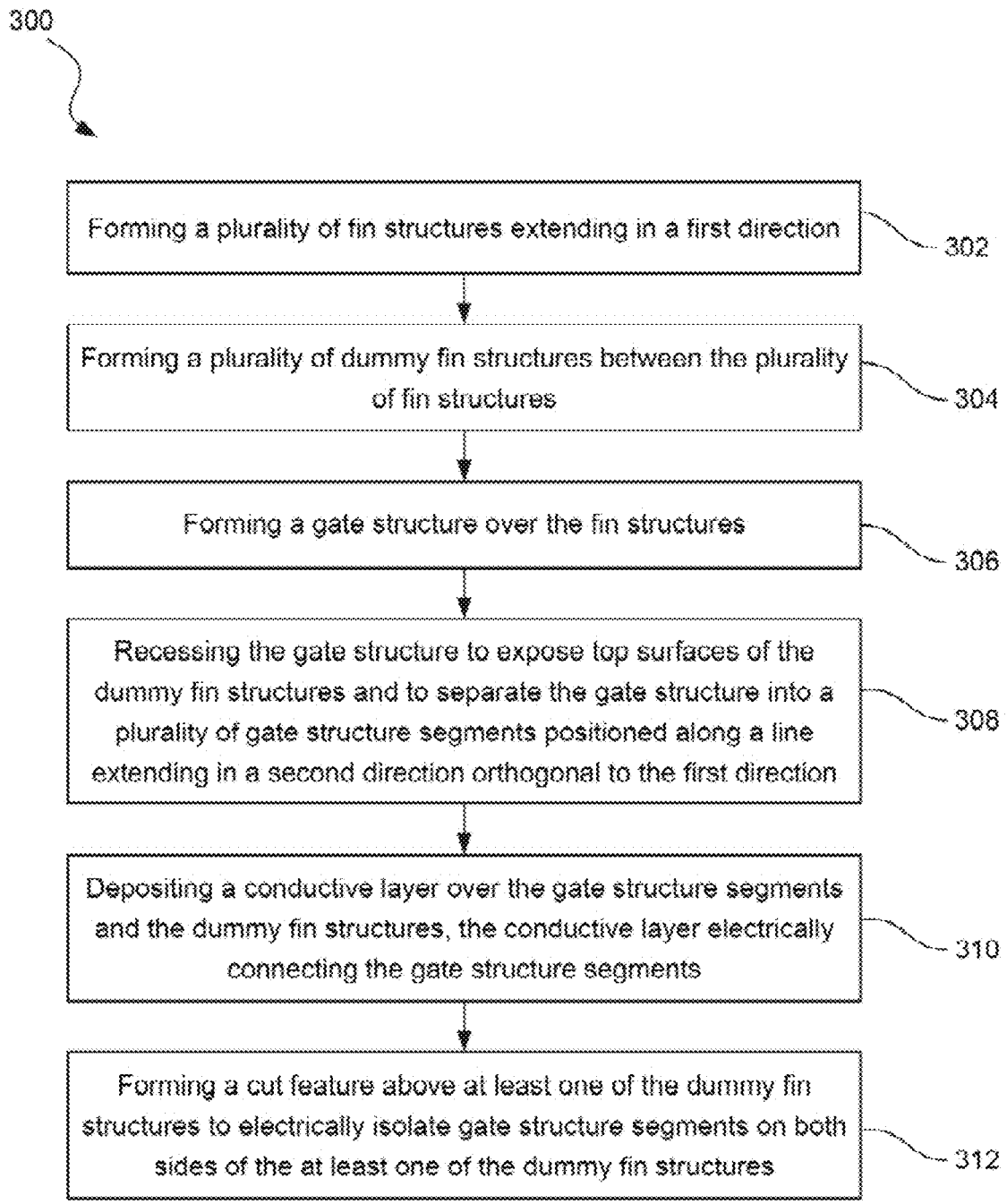
FIG. 3 is a flowchart showing an illustrative method for forming a gate cut feature, according to one example of principles described herein.

FIG. 3 is a flowchart showing an illustrative method for forming a gate cut feature. According to the present example, the method 300 includes a process 302 for forming a plurality of fin structures (e.g., 106a, 106b, 106c, 106d) extending in a first direction. The fin structures may include nanostructures such as nanowires or nanosheets. Such structures are used in gate-all-around (GAA) transistor devices. The principles described herein may be applied to fin structures that have a gate on three sides, as well as fin structures that are processed to include nanostructures. The example described herein includes nanostructures.

To form the fin structures, alternating layers of differing semiconductor materials (e.g., 110, 112) may be deposited onto a substrate (e.g., 102). For example, if the substrate is a silicon substrate, then alternating layers of silicon and silicon germanium (SiGe) may be deposited. Then, a hard mask layer 108 may be deposited on top of the alternating semiconductor layers. The hardmask layer 108 may include at least one of silicon oxide (SiO2), silicon nitride (SiN), silicon carbide (SiC), silicon oxynitride (SiON), silicon oxycarbide (SiOCN), hafnium oxide (HfO2), aluminum oxide (Al2O3), and zirconium oxide (ZrO2). Other materials are contemplated. A photoresist material may then be used to pattern the hard mask layer. The photoresist may then be exposed to a light source through a photomask. The photoresist may then be developed such that the portions of the photoresist remain while other portions are removed. The pattern within the developed photomask is then transferred to the hard mask layer, which is then transferred to the substrate and alternating semiconductor layers through an etching process.

After, the fin structures are formed, an STI layer (e.g., 104) may be deposited, and then etched back to the desired height. The STI layer separates the fin structures from each other. The STI layer may be recessed to a point approximately halfway between a bottom and a top of the fin structure. However, in some examples, the STI layer may be recessed to different heights along the height of the fin structures.

According to the present example, the method 300 further includes a process 304 for forming a plurality of dummy fin structures (e.g., 114a, 114b, 114c) between the plurality of fin structures. The dummy fin structures may be formed by several processes. Specifically, a first dielectric material (e.g., 116 may be conformally deposited within the trenches between the real fin structures, which may be surrounded by a cladding (e.g., 105). This dielectric material may be, for example, silicon nitride (SiN), silicon oxynitride (SiON), or silicon carbide (SiC). Other dielectric materials may be used. The dielectric material may be deposited using an Atomic Layer Deposition (ALD) process.

After the conformal dielectric layer is formed, a second dielectric layer (e.g., 118) is deposited on the first dielectric layer. The second dielectric layer may be an oxide layer. The oxide layer may be, for example, silicon oxide, aluminum oxide, or titanium oxide. Other oxides are contemplated as well. In some examples, the oxide layer may be the same type of material used for the STI layer. The oxide layer may be formed, for example, using a Chemical Vapor Deposition (CVD) process. Other processes may be used as well. After the oxide layer 118 is formed, a Chemical Mechanical Polishing (CMP) process may be applied to planarize the top surface of the workpiece.

An etching process may then be applied to selectively remove the oxide layer while leaving the cladding layer substantially intact. The etching process may be, for example, a dry etching process. In some examples, the etching process is applied so that, after the etching process, the top surface of the oxide layer is about 5-15 nanometers higher than a top surface of the top channel (e.g., 112) of the fin structures.

After the oxide layer has been partially etched back, a high-k dielectric layer (e.g., 120) may be deposited at the top of the dummy fin structures. The high-k dielectric layer may fill the space left by the etching process that etches back the oxide layer. The high-k dielectric layer may be, for example, hafnium oxide (HfO2), zirconium oxide (ZrO2), hafnium aluminum oxide (HfAlOx), hafnium silicon oxide (HfAlOx), or aluminum oxide (A2O3). The bottom surface of the high-k dielectric layer may be about 5-15 nanometers higher than a top surface of the top channel of the fin structures.

The method 300 further includes a process 306 for forming a gate structure over the fin structures. The gate structure (e.g., 124) may be formed by depositing a metal material over the fin structures. In the case that the fin structures include nanostructures such as nanowires or nanosheets, then the material (e.g., 110) surrounding the channel nanosheets or nanowires may be removed prior to depositing the gate structure. Also before the gate structure is deposited, various layers surrounding the channels 112 may be applied. Such layers may include a high-k gate layer and/or workfunction layers.

The method 300 further includes a process 308 for recessing the gate structure to expose top surfaces of the dummy fin structures and to separate the gate structure into a plurality of gate structure segments (e.g., 124a, 124b, 124c, 124d) positioned along a line extending in a second direction orthogonal to the first direction. This etching process may be, for example, a dry etching process. The etching process exposes the top surface of the dummy fin structures.

The method further includes a process 310 for depositing a conductive layer (e.g., 126) over the gate structure segments and the dummy fin structures, the conductive layer electrically connecting the gate structure segments. The conductive layer may include, for example, tungsten. In some examples, a thin layer may be deposited before the conductive layer is deposited. The thin layer may be, for example, titanium nitride (TiN). The conductive layer may be deposited using various depositing techniques, such as CVD.

The method further includes a process 312 for forming a cut feature (e.g., 132a or 132b) above at least one of the dummy fin structures to electrically isolate gate structure segments on both sides of the at least one of the dummy fin structures. The cut feature may be formed within a dielectric layer (e.g., 130) that is deposited on top of the conductive layer. The dielectric layer, as well as the cut feature, may include, for example, silicon nitride (SiN). The dielectric layer may be deposited over the conductive layer. After the dielectric layer is deposited, it may be patterned. The patterning process may involve depositing a hard mask layer and a photoresist layer. The photoresist may then be exposed to a light source through a photomask. The photoresist may then be developed to leave a pattern in the photoresist. That pattern may then be transferred to the hard mask. An etching process, such as a dry etching process, may then be applied to the dielectric layer through the hard mask. That etching process may form trenches that extend all the way to the dummy fin structure. In other words, the etching process may remove both portions of the dielectric layer and portions of the conductive layer to expose top surfaces of some of the dummy fin structures. Thus, the etching process "cuts" the conductive layer. After the etching process is performed, the cut feature is formed within the trench left by the etching process. The cut feature may include a dielectric material and, in some examples, may be the same material as the dielectric layer. In some examples, the width of the cut feature may be less than the width of dummy fin structure to which it connects. However, in some examples the width of cut feature may be greater than the width of dummy fin structure to which it connects.

Thus, according to principles described herein, the spacing constraints for cut features and alignment process is substantially improved by changing the depth at which cut features are able to be made. In comparison with other approaches, a combination of the dummy fin structure and cut feature further reduces a cell height, thereby increasing pattern density with respect to circuit design. Using the principles described herein, the overlay constraints for cut features are reduced because the cut feature may be placed anywhere over a dummy fin structure. Furthermore, the circuit can be designed by spacing fin structures closer together, even where gate features are to be cut.

According to one example, a semiconductor structure includes a plurality of fin structures extending along a first direction, a plurality of gate structure segments positioned along a line extending in a second direction, the second direction being orthogonal to the first direction, wherein the gate structure segments are separated by dummy fin structures. The semiconductor structure further includes a conductive layer disposed over both the gate structure segments and the dummy fin structures to electrically connect at least some of the gate structure segments, and a cut feature aligned with one of the dummy fin structures and positioned to electrically isolate gate structure segments on both sides of the one of the dummy fin structures.

According to one example, a semiconductor structure includes a first gate structure segment and a second gate structure segment extending along a line in a first direction and separated by a first dummy fin structure extending in a second direction orthogonal to the first direction, a third gate structure segment separated from the second gate structure segment by a second dummy fin structure extending along the second direction, a conductive layer connecting the first gate structure segment and the second gate structure segment, and a cut feature positioned above the second dummy fin structure and isolating the second gate structure segment from the third gate structure segment.

According to one example, a method includes forming a plurality of fin structures extending in a first direction, forming a plurality of dummy fin structures between the plurality of fin structures, forming a gate structure over the fin structures, recessing the gate structure to expose top surfaces of the dummy fin structures and to separate the gate structure into a plurality of gate structure segments positioned along a line extending in a second direction orthogonal to the first direction, depositing a conductive layer over the gate structure segments and the dummy fin structures, the conductive layer electrically connecting the gate structure segments, and forming a cut feature above at least one of the dummy fin structures to electrically isolate gate structure segments on both sides of the at least one of the dummy fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first stack of semiconductor layers and a second stack of semiconductor layers on a substrate, wherein the first and second stack of semiconductor layers each include a stack of alternating first and second semiconductor layers;
   forming a dielectric fin structure on the substrate between the first and second stack of semiconductor layers;
   removing the first semiconductor layers from the first and second stack of semiconductor layers;
   forming a first gate structure wrapping around the second semiconductor layers in the first stack of semiconductor layers and a second gate structure wrapping around the second semiconductor layers in the second stack of semiconductor layers;
   forming a conductive layer directly on the first gate structure, the dielectric fin structure and the second gate structure such that the conductive layer extends continuously from the first gate structure to the second gate structure; and
   forming a dielectric cut feature through the conductive layer to separate the conductive layer into a first portion over the first gate structure and a second portion over the second gate structure such that the first gate structure is electrically isolated from the second gate structure after the forming of the dielectric cut feature.

2. The method of claim 1, wherein the forming of the dielectric fin structure on the substrate between the first and second stack of semiconductor layers includes forming the dielectric fin structure directly on the first and second stack of semiconductor layers such that the dielectric fin structure interfaces with the first and second stack of semiconductor layers.

3. The method of claim 1, wherein the forming of the dielectric fin structure on the substrate between the first and second stack of semiconductor layers includes:
   forming a first dielectric material layer directly on the first and second stack of semiconductor layers;
   forming a second dielectric material layer on the first dielectric material layer; and
   forming a third dielectric material layer on the second dielectric material layer, wherein the first, second and third dielectric material layers have different material compositions from each other.

4. The method of claim 1, further comprising forming a dielectric isolation structure on the substrate, and
   wherein the forming of the dielectric fin structure on the substrate between the first and second stack of semiconductor layers incudes forming the dielectric fin structure directly on the dielectric isolation structure such that the dielectric fin structure interfaces with the dielectric isolation structure.

5. The method of claim 1, further comprising forming a cladding layer directly on the first and second stack of semiconductor layers.

6. The method of claim 5, wherein the cladding layer is formed of the same material as one of the first and second semiconductor layers.

7. The method of claim 1, wherein a portion of a sidewall of the dielectric fin structure is exposed after the forming of the first gate structure wrapping around the second semiconductor layers in the first stack of semiconductor layers and after the forming of the second gate structure wrapping around the second semiconductor layers in the second stack of semiconductor layers.

8. The method of claim 1, wherein the dielectric fin structure has a topmost surface facing away from the substrate, and
wherein the first portion of the conductive layer, the second portion of the conductive layer and the dielectric cut feature interface with the topmost surface of the dielectric fin structure after the forming of the dielectric cut feature through the conductive layer.

9. A method comprising:
forming a first stack of semiconductor layers, a second stack of semiconductor layers and a third stack of semiconductor layers on a substrate, wherein the first, second and third stack of semiconductor layers each include a stack of alternating first and second semiconductor layers;
forming a first dielectric fin structure on the substrate between the first and second stack of semiconductor layers and a second dielectric fin structure on the substrate between the second and third stack of semiconductor layers, the first dielectric fin structure having a different width than the second dielectric fin structure, wherein the first and second dielectric fin structures include respective top surfaces facing away from the substrate;
removing the first semiconductor layers from the first, second and third stack of semiconductor layers;
forming a first gate structure wrapping around the second semiconductor layers in the first stack of semiconductor layers, a second gate structure wrapping around the second semiconductor layers in the second stack of semiconductor layers and a third gate structure wrapping around the second semiconductor layers in the third stack of semiconductor layers;
forming a conductive layer directly on the first gate structure, the first dielectric fin structure, the second gate structure, the second dielectric fin structure and the third gate structure such that the conductive layer extends continuously over the first gate structure, the first dielectric fin structure, the second gate structure, the second dielectric fin structure and the third gate structure; and
forming a first dielectric cut feature through the conductive layer to the top surface of the first dielectric fin structure and a second dielectric cut feature through the conductive layer to the top surface of the second dielectric fin structure, wherein a portion of the top surface of the first dielectric fin structure is covered by the conductive layer after the forming of the first dielectric cut feature through the conductive layer to the top surface of the first dielectric fin structure.

10. The method of claim 9, wherein the top surface of the second dielectric fin structure is completely covered the second dielectric cut feature after the forming of the second dielectric cut feature through the conductive layer to the top surface of the second dielectric fin structure.

11. The method of claim 9, wherein the forming of the first dielectric fin structure on the substrate between the first and second stack of semiconductor layers and the second dielectric fin structure on the substrate between the second and third stack of semiconductor layers further includes forming a third dielectric fin structure on the substrate, and
wherein the third dielectric fin structure has a top surface facing away from the substrate,
wherein the forming of the conductive layer directly on the first gate structure, the first dielectric fin structure, the second gate structure, the second dielectric fin structure and the third gate structure further includes forming the conductive layer directly on the top surface of the third dielectric fin structure such that the top surface of the third dielectric fin structure is completely covered by the conductive layer, and
wherein the top surface of the third dielectric fin structure is still completely covered by the conductive layer after the forming of the first dielectric cut feature through the conductive layer to the top surface of the first dielectric fin structure and the forming of the second dielectric cut feature through the conductive layer to the top surface of the second dielectric fin structure.

12. The method of claim 9, further comprising forming a dielectric layer directly on the conductive layer, and
wherein the forming of the first dielectric cut feature through the conductive layer to the top surface of the first dielectric fin structure and the second dielectric cut feature through the conductive layer to the top surface of the second dielectric fin structure includes forming the first and second dielectric cut features through the dielectric layer.

13. The method of claim 9, wherein the first dielectric cut feature interfaces with at least one of the first and second stack of semiconductor layers after the forming of the first dielectric fin structure on the substrate between the first and second stack of semiconductor layers.

14. The method of claim 9, wherein the first and second dielectric fin structures include a high-k dielectric material.

15. The method of claim 9, wherein the second dielectric cut feature interfaces with the top surface and a sidewall surface of the second dielectric fin structure after the forming of the second dielectric cut feature through the conductive layer to the top surface of the second dielectric fin structure.

16. A method comprising:
forming a plurality of fin structures extending in a first direction;
forming a plurality of dummy fin structures between the plurality of fin structures;
forming a gate structure over the fin structures;
recessing the gate structure to expose top surfaces of the dummy fin structures and to separate the gate structure into a plurality of gate structure segments positioned along a line extending in a second direction orthogonal to the first direction;
depositing a conductive layer over the gate structure segments and the dummy fin structures, the conductive layer electrically connecting the gate structure segments; and forming a cut feature above at least one of the dummy fin structures to electrically isolate gate structure segments on both sides of the at least one of the dummy fin structures.

17. The method of claim 16, wherein the forming of the dummy fin structures includes:
   conformally depositing a first dielectric material within a trench positioned between two of the plurality of fin structures;
   depositing a second dielectric material over the first dielectric material, wherein the second dielectric material is different from the first dielectric material; and
   depositing a third dielectric material on top of the first dielectric material.

18. The method of claim 16, wherein the forming of the cut feature includes:
   forming a first dielectric layer on the conductive layer;
   etching through the dielectric layer and the conductive layer to form a trench; and
   depositing a second dielectric layer within the trench.

19. The method of claim 18, wherein the trench exposes at least one of the dummy fin structures from the plurality of dummy fin structures.

20. The method of claim 16, wherein the forming of the cut feature above the at least one of the dummy fin structures includes forming the cut feature on a sidewall and a top surface of the at least one of the dummy fin structures.

* * * * *